United States Patent
Inada et al.

(10) Patent No.: US 10,083,851 B2
(45) Date of Patent: Sep. 25, 2018

(54) ROBOT WITH INNER AND OUTER BELT SECTIONS

(71) Applicant: KAWASAKI JUKOGYO KABUSHIKI KAISHA, Kobe-shi, Hyogo (JP)

(72) Inventors: Takahiro Inada, Kakogawa (JP); Hirohiko Goto, Akashi (JP); Masayuki Saito, Akashi (JP); Takeshi Shibata, Kakogawa (JP); Takayuki Fukushima, Takarazuka (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 72 days.

(21) Appl. No.: 14/917,699

(22) PCT Filed: Sep. 4, 2014

(86) PCT No.: PCT/JP2014/004551
§ 371 (c)(1),
(2) Date: Mar. 9, 2016

(87) PCT Pub. No.: WO2015/033567
PCT Pub. Date: Mar. 12, 2015

(65) Prior Publication Data
US 2016/0218031 A1    Jul. 28, 2016

(30) Foreign Application Priority Data
Sep. 9, 2013 (JP) .................................. 2013-186360

(51) Int. Cl.
*B25J 9/00* (2006.01)
*H01L 21/677* (2006.01)
(Continued)

(52) U.S. Cl.
CPC ...... *H01L 21/68707* (2013.01); *B25J 9/0021* (2013.01); *B25J 19/0079* (2013.01);
(Continued)

(58) Field of Classification Search
CPC .............................. B25J 18/025; B25J 9/0021
See application file for complete search history.

(56) References Cited

U.S. PATENT DOCUMENTS 4,456,077 A * 6/1984 Lagerstedt ............ E21B 19/086
173/147
5,051,055 A * 9/1991 Blatt ........................ B25J 18/02
414/626
(Continued)

FOREIGN PATENT DOCUMENTS

JP    H10-157847 A    6/1998
JP    2004-084824 A    3/2004
(Continued)

OTHER PUBLICATIONS

Dec. 2, 2014 International Search Report issued in International Patent Application No. PCT/JP2014/004551.
(Continued)

*Primary Examiner* — Gerald McClain
(74) *Attorney, Agent, or Firm* — Oliff PLC

(57) ABSTRACT

A seal belt includes inner and outer belt sections. The inner belt section revolves according to the movable member movement. The outer belt section includes, between the inner belt section and an opening, a first portion in which a first end is retained at a movable member inside section portion, the portion being closer to the opening lower end, and the remaining portion extends along the opening and is retained at a third space position, and a second portion in which a first end is retained at an inside section portion, the portion being closer to the lower end, and the remaining
(Continued)

portion extends to a fourth space position along the opening and is retained at the fourth space position. The first portion and second portions lengths are changed in a complementary manner according to the movable member movement. The drive mechanism is surrounded by the inner belt section.

6 Claims, 4 Drawing Sheets

(51) Int. Cl.
  *H01L 21/687* (2006.01)
  *B25J 19/00* (2006.01)
  *F16C 29/08* (2006.01)
  *F16C 29/02* (2006.01)

(52) U.S. Cl.
  CPC ...... *F16C 29/088* (2013.01); *H01L 21/67766* (2013.01); *F16C 29/02* (2013.01)

(56) References Cited

U.S. PATENT DOCUMENTS

| | | | | |
|---|---|---|---|---|
| 5,343,962 A | * | 9/1994 | Daigle | E21B 19/084 173/141 |
| 5,913,722 A | * | 6/1999 | Katou | B25J 9/042 414/940 |
| 6,105,727 A | * | 8/2000 | Nakao | B66F 9/07 187/250 |

FOREIGN PATENT DOCUMENTS

| | | | | |
|---|---|---|---|---|
| JP | 2004084824 A | * | 3/2004 | |
| JP | 2005-093812 A | | 4/2005 | |
| JP | 2005093812 A | * | 4/2005 | |
| TW | 200538382 A | | 12/2005 | |
| TW | 200944459 A | | 11/2009 | |

OTHER PUBLICATIONS

Mar. 15, 2016 International Preliminary Report on Patentability issued in International Patent Application No. PCT/JP2014/004551.

Oct. 22, 2015 Office Action issued in Taiwanese Patent Application No. 103130739.

Apr. 20, 2018 Extended European Search Report issued in European Application No. 14841857.7.

* cited by examiner

ROBOT WITH INNER AND OUTER BELT SECTIONS

TECHNICAL FIELD

The present invention relates to a robot. In particular, the present invention relates to a robot including a dust-proof mechanism for preventing particles generated in a drive unit provided inside of the robot from being released to the outside region of the robot.

BACKGROUND ART

Conventionally, there is known a substrate conveying robot device which conveys substrates (e.g., see Patent Literature 1).

This substrate conveying robot device includes a hollow vertical housing having an opening extending vertically, a vertical shaft movement mechanism accommodated in the vertical housing, a horizontal housing which reciprocates vertically by the vertical shaft movement mechanism, a shield film placed above the horizontal housing, and a shield film placed below the vertical housing. The horizontal housing includes a hollow columnar support member coupled to the vertical shaft movement mechanism and extending through the opening. The shield film located on an upper side (upper shield film) has a fixed end fastened to a support body, is turned back at a moving pulley, extends through a fixed pulley, and then is joined to the upper end surface of the hollow columnar support member. The shield film located on a lower side (lower shield film) has a fixed end fastened to a support body, is turned back at a moving pulley, extends through a fixed pulley, and then is joined to the lower end surface of the hollow columnar support member. The moving pulley of the upper shield film and the moving pulley of the lower shield film are coupled to each other in such a manner that a constant tension is applied to the upper shield film and the lower shield film. In this configuration, when the vertical shaft movement mechanism is driven and the horizontal housing is moved to any position within a vertical stroke, a state in which the opening of the vertical housing is always covered by the hollow columnar support member, the upper shield film and the lower shield film, can be maintained.

CITATION LIST

Patent Literature

Patent Literature 1: Japanese Laid-Open Patent Application Publication No. Hei. 10-157847

SUMMARY OF INVENTION

Technical Problem

The substrate conveying robot device disclosed in Patent Literature 1 can obtain a dust-proof effect, because the opening of the vertical housing is covered by the shield films. However, this duct-proof effect of the above-described substrate conveying robot device is insufficient. In a case where a gas present in a space outside of the housing contains a corrosive gas, the corrosive gas flows into the interior of the vertical housing and thereby the vertical shaft movement mechanism is corroded by the corrosive gas. As a result, the life of the substrate conveying robot device may be reduced. The above problems occur in the same manner in robots which require a dust-proof function, as well as the substrate conveying robot device.

The present invention has been made in view of the above-described problems. A primary object of the present invention is to provide a robot which can improve a dust-proof effect against particles generated in a drive mechanism, compared to a prior art example.

A secondary object of the present invention is to provide a robot which can prevent corrosion of the drive mechanism, which would be caused by entry of a corrosive gas from the outside region of the robot into the drive mechanism.

Solution to Problem

To achieve the above-described object, according to an aspect of the present invention, a robot comprises a casing formed with an opening extending in a specified direction and having a first end and a second end in the specified direction; a movable member extending in an inside region and an outside region of the casing through the opening, a portion of the movable member, the portion extending in the outside region of the casing, being provided with a hand; a drive mechanism accommodated in the casing and configured to drive an inside section of the movable member, the inside section extending in the inside region of the casing, to move the movable member in the specified direction in which the opening extends; and a seal belt accommodated in the inside region of the casing, wherein the seal belt includes an inner belt section and an outer belt section, each of the inner belt section and the outer belt section extending in the specified direction in which the opening extends in such a manner that both side edges of each of the inner belt section and the outer belt section are located outward relative to both side edges of the opening, when viewed from a normal line direction of the opening, wherein in the inside region of the casing, a first end of the inner belt section is retained at a portion of the inside section of the movable member, the portion being closer to the first end of the opening, a remaining portion of the inner belt section which is different from the first end of the inner belt section extends along the opening, from the portion of the inside section of the movable member, the portion being closer to the first end of the opening, to a first space position which is closer to the first end of the opening than the inside section of the movable member is, the remaining portion of the inner belt section extends from the first space position to a second space position which is closer to the second end of the opening than the inside section of the movable member is in such a manner that the remaining portion is reversed at an intermediate position between the first space position and the second space position, and further extends from the second space position along the opening, a second end of the inner belt section is retained at a portion of the inside section of the movable member, the portion being closer to the second end of the opening, and the inner belt section revolves according to movement of the movable member, wherein the outer belt section includes, between the inner belt section and the opening, a first portion in which a first end of the first portion is retained at the portion of the inside section of the movable member, the portion being closer to the first end of the opening, and a remaining portion of the first portion which is different from the first end of the first portion extends along the opening, from the portion of the inside section of the movable member, the portion being closer to the first end of the opening, to a third space position which is beyond the first end of the opening, and is retained at the third space position, and a second portion in which a first end of the second portion is retained at the portion of the inside section of the movable member, the portion being closer to the second end of the opening, and a remaining portion of the second portion which is different from the first end of the second portion extends along the opening, from the portion of the inside section of the movable member, the portion being closer to the second end of the opening, to a fourth space position which is beyond the second end of the opening, and is retained at the fourth space position, and a length of one of the first portion and the second portion is changed to be increased by a decrease in a length of the other of the first portion and the second portion according to the movement of the movable member, and wherein the drive mechanism is placed in a space surrounded by the inner belt section.

In accordance with this configuration, both of the outer belt section and the inner belt section cover the opening funned in the casing, against the drive mechanism placed in the space surrounded by the inner belt section. This makes it possible to improve the effect (dust-proof effect) of preventing particles generated in the drive mechanism from being released to the outside space of the casing, compared to a prior art example.

The robot may comprise: a first movement roller attached to the portion of the inside section of the movable member, the portion being closer to the first end of the opening in such a manner that the first movement roller is rotatable around a rotational axis extending in a width direction of the opening; a second movement roller attached to the portion of the inside section of the movable member, the portion being closer to the second end of the opening in such a manner that the second movement roller is rotatable around a rotational axis extending in the width direction of the opening; a first fixed roller placed at the first space position and fastened to the casing in such a manner that the first fixed roller is rotatable around a rotational axis extending in the width direction of the opening; and a second fixed roller placed at the second space position and fastened to the casing in such a manner that the second fixed roller is rotatable around a rotational axis extending in the width direction of the opening, wherein the first end of the inner belt section and the first end of the first portion of the outer belt section may be continuous with each other to form a continuous portion, and the continuous portion may be wrapped around the first movement roller and retained at the portion of the inside section of the movable member, the portion being closer to the first end of the opening, wherein the remaining portion of the first portion of the outer belt section may extend from the first movement roller to the third space position and may be fastened to the casing at the third space position, wherein the second end of the inner belt section and the first end of the second portion of the outer belt section may be continuous with each other to form a continuous portion, and the continuous portion may be wrapped around the second movement roller and retained at the portion of the inside section of the movable member, the portion being closer to the second end of the opening, wherein the remaining portion of the second portion of the outer belt section may extend from the second movement roller to the fourth space position and may be fastened to the casing at the fourth space position, and wherein a portion of the inner belt section which is between the first end of the inner belt section and the second end of the inner belt section may be wrapped around the first fixed roller and the second fixed roller, and may be wrapped around a roller for reversing the inner belt section at an intermediate position between the first fixed roller and the second fixed roller.

In accordance with this configuration, it becomes possible to prevent generation of the particles, which would be caused by the fact that the outer belt section of the seal belt and the casing scrape against each other, according to the movement of the movable member.

The robot may comprise a third fixed roller placed at the first space position and fastened to the casing in such a manner that the third fixed roller is rotatable around a rotational axis extending in a width direction of the opening; a fourth fixed roller placed at the second space position and fastened to the casing in such a manner that the fourth fixed roller is rotatable around a rotational axis extending in the width direction of the opening; a fifth fixed roller placed outward relative to the first end of the opening and the third fixed roller in the inside region of the casing, and fastened to the casing in such a manner that the fifth fixed roller is rotatable around a rotational axis extending in the width direction of the opening; and a sixth fixed roller placed outward relative to the second end of the opening and the fourth fixed roller in the inside region of the casing, and fastened to the casing in such a manner that the sixth fixed roller is rotatable around a rotational axis extending in the width direction of the opening, wherein the first end of the inner belt section is fastened to the portion of the inside section of the movable member, the portion being closer to the first end of the opening, and the second end of the inner belt section may be fastened to the portion of the inside section of the movable member, the portion being closer to the second end of the opening, wherein a portion of the inner belt section which is between the first end of the inner belt section and the second end of the inner belt section may be wrapped around the third fixed roller and the fourth fixed roller, and is wrapped around a roller for reversing the inner belt section at an intermediate position between the third fixed roller and the fourth fixed roller, wherein the first end of the first portion of the outer belt section may be fastened to the portion of the inside section of the movable member, the portion being closer to the first end of the opening, and the first end of the second portion of the outer belt section may be fastened to the portion of the inside section of the movable member, the portion being closer to the second end of the opening, and wherein the remaining portion of the first portion of the outer belt section may extend to a location that is beyond the third space position at which the remaining portion of the first portion is retained, the remaining portion of the second portion of the outer belt section may extend to a location that is beyond the fourth space position at which the remaining portion of the second portion is retained, the second end of the first portion and the second end of the second portion are continuous with each other, a portion of the outer belt section which is between the first end of the first portion and the first end of the second portion is located between the inner belt section and the casing, wrapped around the fifth fixed roller and the sixth fixed roller, and wrapped around a roller for reversing the outer belt section at an intermediate position between the fifth fixed roller and the sixth fixed roller, and wherein the inner belt section and the outer belt section separately constitute an inner belt and an outer belt, respectively.

The robot may further comprise a separating wall placed to extend along a portion of the inner belt section, the portion being located between the first end of the inner belt section and the first space position, and being closer to the drive mechanism, and along a portion of the inner belt section, the portion being located between the second end of the inner belt section and the second space position, and being closer to the drive mechanism.

In accordance with this configuration, the separating wall placed between the inner belt section and the drive mechanism can more effectively prevent a situation in which the particles generated in the drive mechanism located in the space surrounded by the inner belt section are released to the outside space of the casing.

The robot may further comprise an intake mechanism which intakes a gas in a buffering space formed between the outer belt section and the inner belt section.

In accordance with this configuration, since the intake mechanism intakes the gas present in the buffering space formed between the outer belt section and the inner belt section, it becomes possible to effectively prevent the gas present in the outside space of the casing from flowing into the space surrounded by the inner belt section. In a case where the gas present in the outside space of the casing contains a corrosive gas, it becomes possible to prevent a situation in which this gas flows into the space surrounded by the inner belt section and thereby the drive mechanism is corroded by the corrosive gas. In addition, since it becomes possible to prevent the gas present in the space surrounded by the inner belt section from being released to the outside space of the casing, it becomes possible to more effectively prevent a situation in which the particles generated in the drive mechanism and contained in the gas present in the space surrounded by the inner belt section are released to the outside space of the casing and thus the yield of a product is reduced.

Advantageous Effects of Invention

The present invention has an advantage that the effect (dust-proof effect) of preventing the particles generated in the drive mechanism can be improved in a robot, compared to a prior art example.

DESCRIPTION OF EMBODIMENTS

Hereinafter, the embodiments of the present invention will be described with reference to the drawings. The present invention is not limited by the embodiments. Hereinafter, throughout the drawings, the same or corresponding components are identified by the same reference symbols, and will not be described repeatedly.

Embodiment 1

Figure 1:
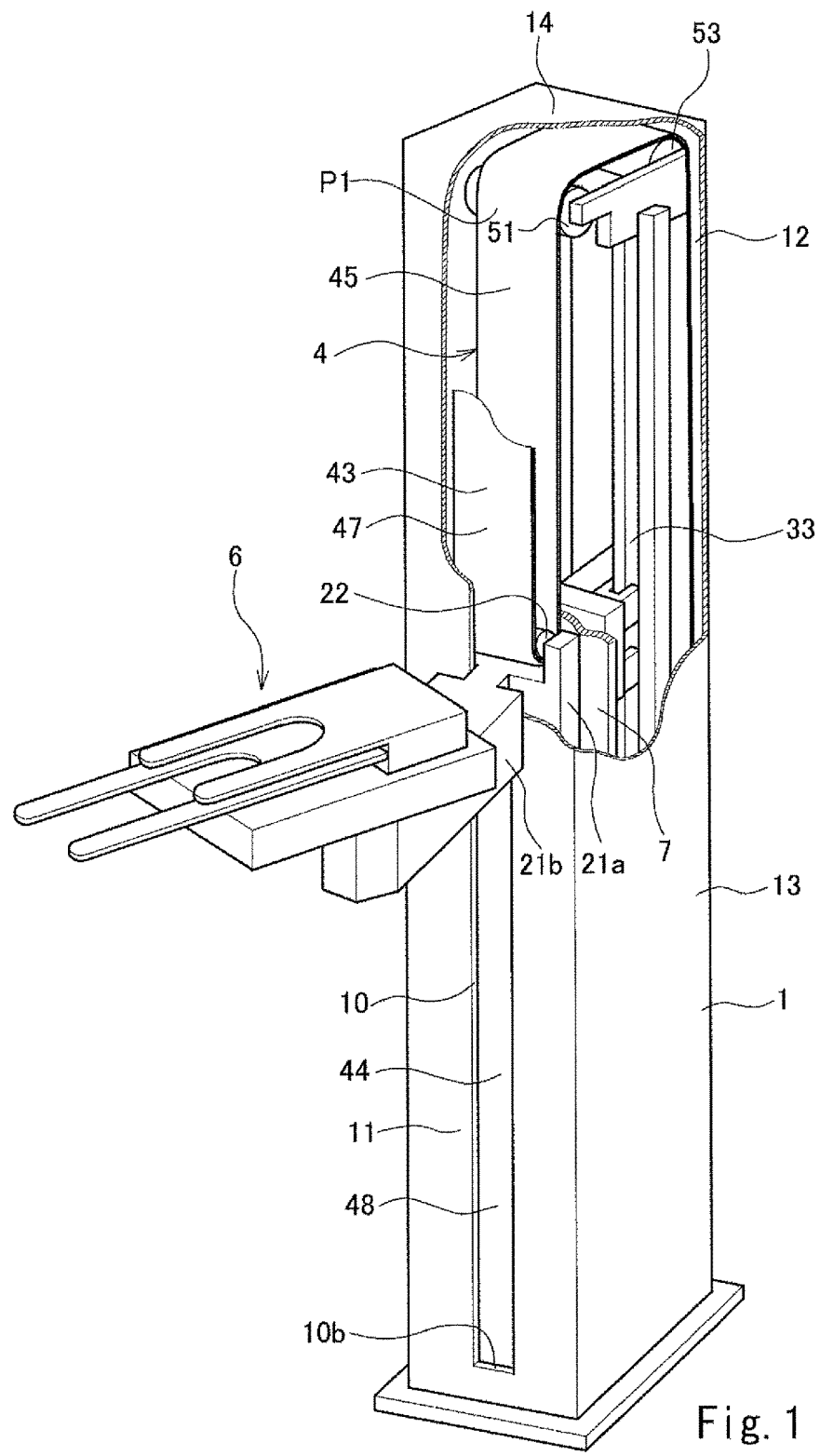
FIG. 1 is a perspective view showing the exemplary configuration of a robot according to Embodiment 1 of the present invention, a part of which is cut away.
Figure 2:
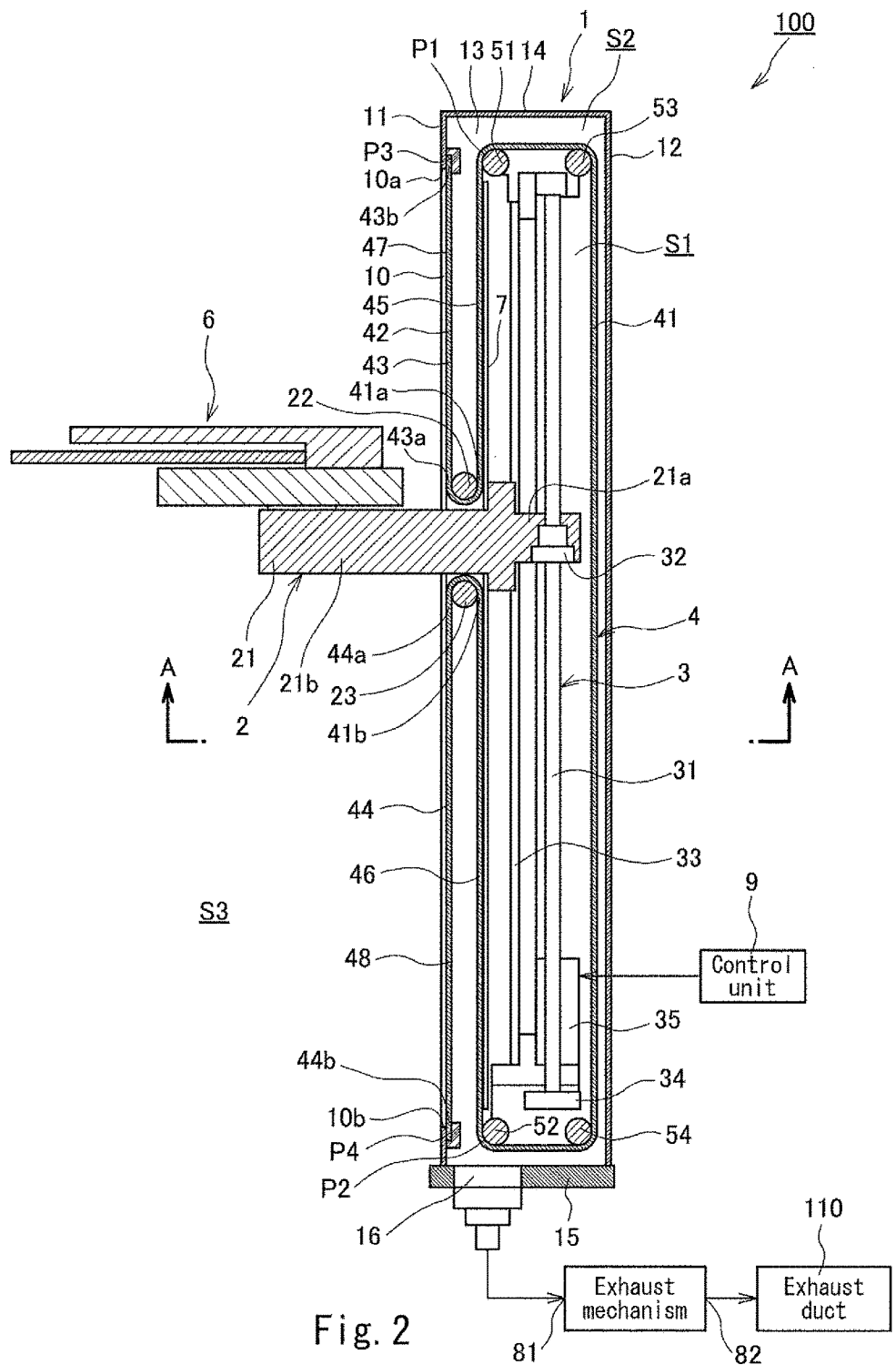
FIG. 2 is a longitudinal sectional view showing the exemplary configuration of the robot of FIG. 1.
Figure 3:
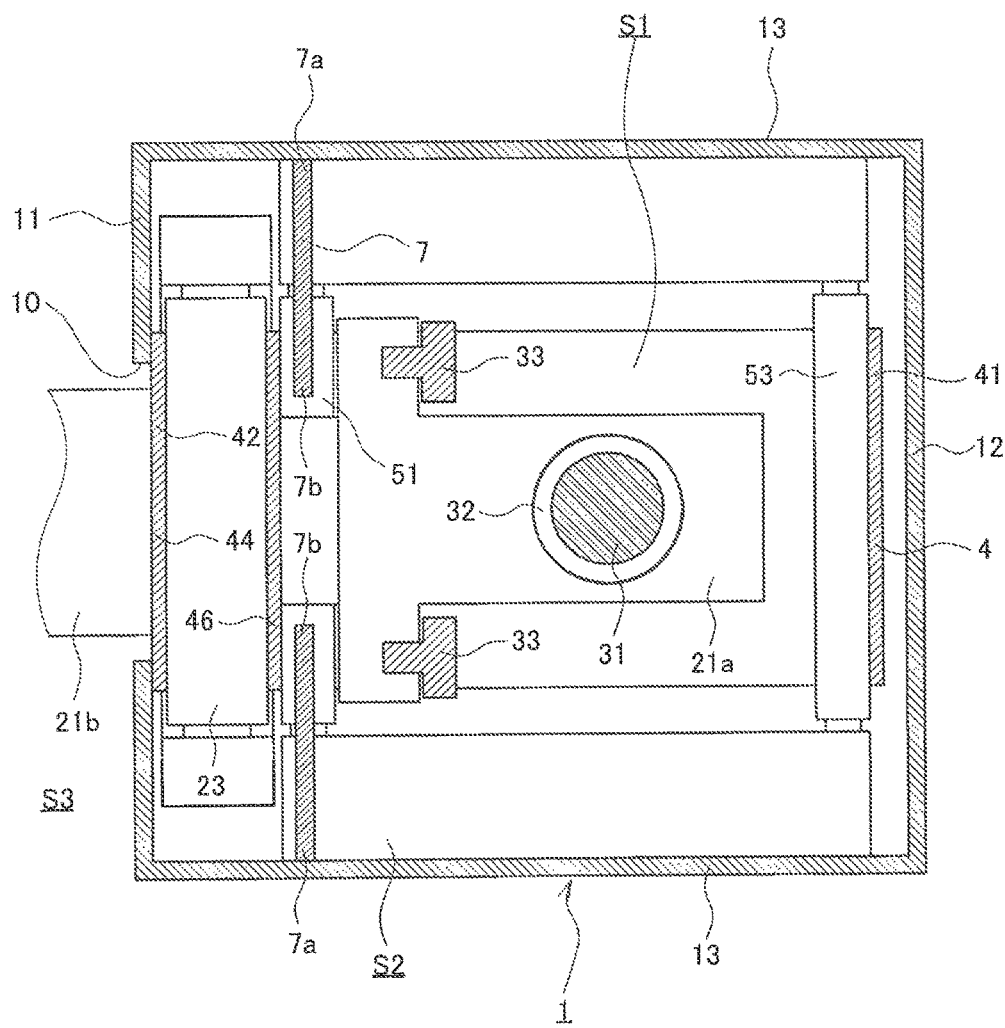
FIG. 3 is a sectional view taken along A-A of FIG. 2.

FIG. 1 is a perspective view showing the exemplary configuration of a robot 100 according to Embodiment 1 of the present invention, a part of which is cut away. FIG. 2 is a longitudinal sectional view showing the exemplary configuration of the robot 100. FIG. 3 is a sectional view taken along A-A of FIG. 2.

The robot 100 is a robot used to convey substrates in equipment in which various kinds of process treatments such as a thermal treatment, an impurity implantation treatment, a thin film formation treatment, a lithography treatment, a washing treatment, and a flattening treatment, are performed with respect to the substrates. The robot 100 is not limited to this substrate conveying robot. It is sufficient that the robot 100 includes a dust-proof mechanism which prevents particles generated in a drive unit placed inside of the robot 100 from being released to the outside region of the robot 100. The substrates are, for example, semiconductor wafers, glass wafers, etc. As examples of the semiconductor wafers, there are silicon wafers, sapphire (monocrystal alumina) wafers, or other kinds of wafers. As shown in FIGS. 1 and 2, the robot 100 includes a casing 1, a movable member 2, a drive mechanism 3, a seal belt 4, a plurality of fixed rollers fastened to the casing 1, a hand 6, and a control unit 9.

The casing 1 is a box member. The casing 1 is formed with an opening 10 extending in a specified direction and having a first end and a second end in the specified direction in which the opening 10 extends.

In the exemplary aspect of the present embodiment, as shown in FIG. 2, the casing 1 has a hollow rectangular parallelepiped shape extending vertically (in a vertical direction), and includes a front wall 11, a back wall 12 placed to face the front wall 11, a pair of side walls 13 coupling the both side edges of the front wall 11 to the both side edges of the back wall 12, respectively, an upper wall 14 coupling the upper edges of the front wall 11 to the upper edges of the back wall 12, respectively, and a bottom wall 15 coupling the lower edges of the front wall 11 to the lower edges of the back wall 12, respectively. The front wall 11 is formed with the rectangular opening 10 extending vertically in a linear shape. An upper end 10a of the opening 10 constitutes the above-described first end, while a lower end 10b of the opening 10 constitutes the above-described second end. The back wall 12 includes an exhaust port 16 which is a through-hole through which the inside region of the casing 1 is in communication with the outside region of the casing 1.

The movable member 2 extends in the inside region of the casing 1 and the outside region of the casing 1 through the opening 10. The hand 6 is provided on a portion of the movable member 2, the portion extending in the outside region of the casing 1. The hand 6 is constituted by a known robot hand, and therefore the configuration of the hand 6 will not be described.

In the exemplary aspect of the present embodiment, the movable member 2 includes a movable mount 21, a first movement roller 22, and a second movement roller 23. The movable mount 21 extends in the inside region of the casing 1 and the outside region of the casing 1. A portion of the movable mount 21, the portion extending in the inside region of the casing 1 which is inward relative to the opening 10, constitutes an inside section 21a of the movable mount 21. A portion of the movable mount 21, the portion extending in the outside region of the casing 1 which is outward relative to the opening 10, constitutes an outside section 21b of the movable mount 21. The hand 6 is provided on the outside section 21b of the movable member 2. The first movement roller 22 is a columnar (cylindrical) member extending in the width direction of the opening 10. The first movement roller 22 is attached to the movable mount 21 in such a manner that the first movement roller 22 is located above a portion of the inside section 21a of the movable mount 21, the portion being in the vicinity of the opening 10 (a portion of the inside section 21a of the movable member 2, the portion being closer to the first end of the opening 10). The first movement roller 22 is rotatably supported at both ends thereof on the movable mount 21. The first movement roller 22 is attached to the movable mount 21 in such a manner that the first movement roller 22 is rotatable around a rotational axis extending in the vehicle width direction of the opening 10. The second movement roller 23 is a columnar (cylindrical) member extending in the width direction of the opening 10. The second movement roller 23 is attached to the movable mount 21 in such a manner that the second movement roller 23 is located below a portion of the inside section 21a of the movable mount 21, the portion being in the vicinity of the opening 10 (a portion of the inside section 21a of the movable member 2, the portion being closer to the second end of the opening 10). The second movement roller 23 is rotatably supported at both ends thereof on the movable mount 21. The second movement roller 23 is attached to the movable mount 21 in such a manner that the second movement roller 23 is rotatable around a rotational axis extending in the vehicle width direction of the opening 10.

The drive mechanism 3 is accommodated in the casing 1. The drive mechanism 3 drives the inside section 21a of the movable mount 21 of the movable member 2 to move the movable member 2 in the direction in which the opening 10 extends, namely, the vertical direction. The drive mechanism 3 is located in an inside space S1 surrounded by an inner belt section 41 (which will be described later) of the seal belt 4.

In the exemplary aspect of the present embodiment, the drive mechanism 3 is a well-known ball screw mechanism. The drive mechanism 3 includes a ball screw 31 which is rotatable around a rotational axis extending vertically, a slider 32 which is threadingly engageable with the ball screw 31, a guide rail 33 which extends in parallel with the ball screw 31, inhibits the movable mount 21 from being rotated together with the ball screw 31, and guides the slider 32 in a direction in which the slider 32 extends, and a servo motor 35 which rotates the ball screw 31 via a gear 34 mounted on the lower end of the ball screw 31. The ball screw 31 is attached to the casing 1 via a bearing which is not shown. The both ends of the guide rail 33 are fastened to the casing 1 via support members which are not shown. The servo motor 35 is fastened to the casing 1. The inside section 21a of the movable mount 21 is secured to the slider 32. By the rotation of the ball screw 31, the slider 32 is guided by the guide rail 33 over a specified stroke range and moves in the direction of the rotational axis of the ball screw 31 (the vertical direction). Thereby, the movable member 2 moves vertically with respect to the casing 1 over the specified stroke range. The rotation of the servo motor 35 is controlled by the control unit 9.

Note that the drive mechanism 3 is not limited to the ball screw mechanism. Alternatively, the drive mechanism 3 may be, for example, a rack and pinion mechanism, or a linear motor mechanism.

The seal belt 4 is accommodated in the casing 1. The seal belt 4 includes an inner belt section 41 extending in the direction in which the opening 10 extends and an outer belt section 42 extending in the direction in which the opening 10 extends in such a manner that the both side edges of the inner belt section 41 and the both side edges of the outer belt section 42 are located outward relative to the both side edges of the opening 10, when viewed from the normal line direction of the opening 10.

In the inside region of the casing 1, a first end (one end) 41a of the inner belt section 41 is retained at the upper surface of the portion of the inside section 21a of the movable mount 21, the portion being in the vicinity of the opening 10 (the portion of the inside section 21a of the movable member 2, the portion being closer to the first end of the opening 10). The remaining portion of the inner belt section 41 extends along the opening 10 from the upper surface of the portion of the inside section 21a of the movable mount 21, the portion being in the vicinity of the opening 10, to a first space position P1 which is closer to the upper end 10a of the opening 10 than the inside section 21a of the movable mount 21 is. This portion of the inner belt section 41, extending from the upper surface of the portion of the inside section 21a of the movable mount 21, the portion being in the vicinity of the opening 10, to the first space position P1, constitutes an inner upper seal section 45 of the seal belt 4. The inner belt section 41 extends from the first space position P1 to a second space position P2 which is closer to the lower end 10b of the opening 10 than the inside section 21a of the movable mount 21 is in such a manner that the inner belt section 41 is reversed at an intermediate position between the first space position P1 and the second space position P2. The inner belt section 41 extends from the second space position P2 along the opening 10. A second end (the other end) 41b of the inner belt section 41 is retained at the lower surface of the portion of the inside section 21a of the movable mount 21, the portion being in the vicinity of the opening 10 (the portion of the inside section 21a of the movable member 2, the portion being closer to the second end of the opening 10). A portion of the inner belt section 41, extending from the second space position P2 to the lower surface of the portion of the inside section 21a of the movable mount 21, the portion being in the vicinity of the opening 10, constitutes an inner lower seal section 46 of the seal belt 4. The inner belt section 41 is configured to revolve according to the movement of the movable member 2.

The outer belt section 42 includes a first portion 43 and a second portion 44. A first end (one end) 43a of the first portion 43 is retained at the upper surface of the portion of the inside section 21a of the movable mount 21, the portion being the vicinity of the opening 10 (the portion of the inside section 21a of the movable member 2, the portion being closer to the first end of the opening 10), between the inner belt section 41 and the opening 10. The remaining portion of the first portion 43 extends along the opening 10, from the upper surface of the portion of the inside section 21a of the movable mount 21, the portion being in the vicinity of the opening 10, to a third space position P3 which is beyond (above) the upper end 10a of the opening 10. This portion extending from the upper surface of the portion of the inside section 21a of the movable mount 21, the portion being in the vicinity of the opening 10, to the third space position P3, constitutes an outer upper seal section 47 of the seal belt 4. A second end (the other end) 43b of the first portion 43 is retained at the third space position P3. A first end (one end) 44a of the second portion 44 is retained at the lower surface of the portion of the inside section 21a of the movable mount 21, the portion being in the vicinity of the opening 10 (the portion of the inside section 21a of the movable member 2, the portion being closer to the second end of the opening 10), between the inner belt section 41 and the opening 10. The remaining portion of the second portion 44 extends along the opening 10, from the lower surface of the portion of the inside section 21a of the movable mount 21, the portion being in the vicinity of the opening 10, to a fourth space position P4 which is beyond (below) the lower end 10b of the opening 10. This portion extending from the lower surface of the portion of the inside section 21a of the movable mount 21, the portion being in the vicinity of the opening 10, to the fourth space position P4, constitutes an outer lower seal section 48 of the seal belt 4. A second end (the other end) 44b of the second portion 44 is retained at the fourth space position P4. The first portion 43 and the second portion 44 are configured in such a manner that the length of one of the first portion 43 and the second portion 44 is changed to be increased by a dimension corresponding to a decrease in the other of the first portion 43 and the second portion 44, according to the movement of the movable member 2.

In the exemplary aspect of the present embodiment, the seal belt 4 is formed of a single band member which does not substantially have a stretch property. The first end 41a of the inner belt section 41 of the seal belt 4 and the first end 43a of the first portion 43 of the outer belt section 42 are continuous with each other to form a continuous portion. This continuous portion is wrapped around the first movement roller 22 and is retained by the movable member 2. The above-described remaining portion of the first portion 43 of the outer belt section 42 extends from the first movement roller 22 to the third space position P3, and is fastened to the casing 1 at the third space position P3.

The second end 41b of the inner belt section 41 of the seal belt 4 and the first end 44a of the second portion 44 of the outer belt section 42 are continuous with each other to form a continuous portion. This continuous portion is wrapped around the second movement roller 23 and is retained at the movable member 2. The above-described remaining portion of the second portion 44 of the outer belt section 42 extends from the second movement roller 23 to the fourth space position P4, and is fastened to the casing 1 at the fourth space position P4.

The both side edges of the remaining portion of the first portion 43 and the both side edges of the remaining portion of the second portion 44, of the outer belt section 42, are configured to contact the front wall 11 of the casing 1. This makes it possible to prevent formation of a gap between the opening 10 and the seal belt 4. As a result, the ambience of the inside space of the casing 1 and the ambience of the outside space of the casing 1 can be effectively isolated from each other.

A portion of the inner belt section 41 which is between the first end 41a and the second end 41b is wrapped around a plurality of fixed rollers (a first fixed roller 51, a second fixed roller 52, a first reversing roller 53, and a second reversing roller 54 which will be described later) fastened to the casing 1.

The plurality of fixed rollers include the first fixed roller 51, the second fixed roller 52, the first reversing roller 53, and the second reversing roller 54. The first fixed roller 51, the second fixed roller 52, the first reversing roller 53, and the second reversing roller 54, are columnar (cylindrical) members extending in the width direction of the opening 10. Each of the first fixed roller 51, the second fixed roller 52, the first reversing roller 53, and the second reversing roller 54, is rotatably supported at both ends thereof on the casing 1 via support members which are not shown. Each of the first fixed roller 51, the second fixed roller 52, the first reversing roller 53, and the second reversing roller 54, is fastened to the casing 1 in such a manner that each of them is rotatable around a rotational axis extending in the width direction of the opening 10. Each of the first fixed roller 51, the second fixed roller 52, the first reversing roller 53, and the second reversing roller 54, may be directly mounted and fastened to the casing 1. The first fixed roller 51 is located at the first space position P1. The second fixed roller 52 is located at the second space position P2. The first reversing roller 53 is located between the first fixed roller 51 and the back wall 12. The second reversing roller 54 is located between the second fixed roller 52 and the back wall 12. The first reversing roller 53 and the second reversing roller 54 constitute the rollers for reversing the inner belt section 41 at intermediate positions, between the first fixed roller 51 and the second fixed roller 52, in the direction in which the seal belt 4 extends. The inner belt section 41 of the seal belt 4 is wrapped around the first fixed roller 51, the first reversing roller 53, the second reversing roller 54, and the second fixed roller 52 in this order, in a direction from the first end 41a of the inner belt section 41 toward the second end 41b of the inner belt section 41.

As described above, the drive mechanism 3 is located in the inside space S1 surrounded by the inner belt section 41 of the seal belt 4. A buffering space S2 is formed between the casing 1 and the outer belt section 42, and the inner belt section 41. Therefore, the exhaust port 16 formed in the bottom wall 15 connects the outside space S3 of the casing 1 to the buffering space S2 of the casing 1.

In the exemplary aspect of the present embodiment, the robot 100 further includes a pair of separating walls 7 and an exhaust mechanism (intake mechanism) 8.

As shown in FIG. 2, the pair of separating walls 7 are placed to extend along a portion of the inner belt section 41, the portion being located between the first end 41a of the inner belt section 41 and the first space position P1 and being closer to the drive mechanism 3, and a portion of the inner belt section 41, the portion being located between the second end 41b of the inner belt section 41 and the second space position P2 and being closer to the drive mechanism 3, respectively. More specifically, as shown in FIGS. 2 and 3, the pair of separating walls 7 are located at a boundary between the inside space S1 and the buffering space S2. The pair of separating walls 7 are placed between the inner upper seal section 45 and the inner lower seal section 46 of the seal belt 4, and the drive mechanism 3. The pair of separating walls 7 are placed to extend along the inner upper seal section 45 and the inner lower seal section 46, respectively. Outer side edge portions 7a of the pair of separating walls 7 are attached to the inner surfaces of the pair of side walls 13, respectively, and extend in the width direction of the opening 10. Inner side edge portions 7b of the pair of separating walls 7 are located inward relative to the side edges of the inner upper seal section 45 and the side edges of the inner lower seal section 46, of the inner belt section 41, respectively, when viewed from the normal line direction of the opening 10. The inside section 21a of the movable mount 21 is moved vertically between the inner side edge portions 7b of the pair of separating walls 7. This makes it possible to isolate the ambience of the inside space S1 and the ambience of the buffering space S2 from each other. As a result, it becomes possible to more effectively prevent a situation in which particles generated in the drive mechanism 3 located in the inside space S1 are released to the outside space of the casing 1.

The exhaust mechanism 8 is a mechanism which intakes a gas present in the buffering space S2. In the exemplary aspect of the present embodiment, the exhaust mechanism 8 is constituted by, for example, a blower device such as a fan or a blower, an exhaust pump, etc. The gas exhaust mechanism 8 includes a suction port 81 and a discharge port 82. The suction port 81 is connected to the intake port 16. The discharge port 82 is connected to an exhaust duct 110. The exhaust mechanism 8 is driven to suction the gas present in the buffering space S2 via the intake port 16 and exhausts this gas to the exhaust duct 110 through the discharge port 82. Thereby, a gas pressure in the buffering space S2 with respect to a gas pressure in the inside space S1 becomes a negative pressure, so that the gas present in the inside space S1 flows out to the buffering space S2. When the exhaust mechanism 8 is driven, the gas pressure in the buffering space S2 with respect to a gas pressure in the outside space S3 also becomes a negative pressure. Therefore, the gas which has flowed out of the inside space S1 to the buffering space S2 is exhausted to the exhaust duct 110 through the exhaust port 16 substantially without flowing out to the outside space S1 through the opening 10. In this way, it becomes possible to prevent the gas from flowing out of the inside space S1 to the outside space S3. As a result, it becomes possible to more effectively prevent a situation in which the particles generated in the drive mechanism 3 and contained in the gas present in the inside space S1 are released to the outside space S3, and thereby the yield of a product is reduced.

As described above, when the exhaust mechanism 8 is driven, the gas pressure in the buffering space S2 with respect to the gas pressure in the outside space S3 becomes the negative pressure. For this reason, the seal belt 4 which is in contact with the front wall 11 is slightly deformed toward the interior of the casing 1, and as a result, a gap is formed between the front wall 11 and the seal belt 4. The gas flows from the outside space S1 into the buffering space S2 through this gap. However, as described above, the gas pressure in the buffering space S2 with respect to the gas pressure in the inside space S1 becomes the negative pressure. Therefore, the gas which has flowed from the outside space S3 into the buffering space S2 is exhausted to the exhaust duct 110 through the exhaust port 16 substantially without flowing from the buffering space S2 into the inside space S1. In the above-described manner, it becomes possible to effectively prevent the gas from flowing from the outside space S3 into the inside space S1. In a case where the gas present in the outside space S3 contains a corrosive gas, it becomes possible to prevent a situation in which this gas flows into the inside space S1 and thereby the drive mechanism 3 is corroded by the corrosive gas.

Exemplary Operation

Next, the exemplary operation of the robot 100 will be described.

When the control unit 9 drives the drive mechanism 3 to move the movable member 2 upward, a tension is generated in the inner lower seal section 46 of the inner belt section 41 such that the inner lower seal section 46 shifts toward the second movement roller 23, and the inner belt section 41 of the seal belt 4 revolves so as to shift in a direction (clockwise direction in FIG. 2) from the first movement roller 22 toward the second movement roller 23, according to the movement of the movable member 2, as shown in FIG. 2. Then, the seal belt 4 is moved in such a manner that the first portion 43 of the outer belt section 42 shifts to the inner upper seal section 45 of the inner belt section 41, and the first end 43a of the first portion 43 of the outer belt section 42 shifts upward. This reduces the length of the first portion 43. In addition, the seal belt 4 is moved in such a manner that the inner lower seal section 46 of the inner belt section 41 shifts toward the second portion 44 of the outer bent section 42, and the first end 44a of the second portion 44 of the outer belt section 42 shifts upward. This causes the length of the second portion 44 to be increased by a decrease in the length of the first portion 43. Thus, even when the movable member 2 moves, the length and extension position of the whole of the outer belt section 42 are not changed. As a result, no gap is formed between the upper end 10a of the opening 10 and the movable member 2, and between the lower end 10b of the opening 10 and the movable member 2. This makes it possible to isolate the ambience of the outside space S3 and the ambience of the inside space S1 from each other. In particular, between the outside space S3 and the inside space S1, the outer upper seal section 47, the inner upper seal section 45, the outer lower seal section 48, and the inner lower seal section 46 are located. This makes it possible to effectively isolate the ambience of the outside space S3 and the ambience of the inside space S1 from each other. When the first portion 43 of the outer belt section 42 shifts to the inner belt section 41, the second end 43b of the first portion 43 of the outer belt section 42 of the seal belt 4 is retained at the third space position P3. Because of this, the first portion 43 of the seal belt 4 does not move relatively to the front wall 11 of the casing 1, and hence the both side edges of the first portion 43 and the front wall 11 of the casing 1 do not scrape against each other. Also, when the inner lower seal section 46 of the inner belt section 41 shifts to the second portion 44 of the outer bent section 42, the second end 44b of the second portion 44 of the outer belt section 42 of the seal belt 4 is retained at the fourth space position P4. Because of this, the second portion 44 of the seal belt 4 does not move relatively to the front wall 11 of the casing 1, and hence the both side edges of the second portion 44, and the front wall 11 of the casing 1 do not scrape against each other. This makes it possible to prevent generation of the particles, which would be caused by the fact that the outer belt section 42 of the seal belt 4 and the casing 1 scrape against each other, according to the movement of the movable member 2.

As described above, in the robot 100 of the present invention, when the control unit 9 drives the drive mechanism 3 to move the movable member 2, the inner belt section 41 revolves, and the first end 43a of the first portion 43 and the first end 44a of the second portion 44 of the inner belt section 41 shift in the direction in which the movable member 2 moves, according to the movement of the movable member 2. Therefore, no gap is formed between the upper end 10a of the opening 10 and the movable member 2, and between the lower end 10b of the opening 10 and the movable member 2, while the movable member 2 is moving. That is, while the movable member 2 is moving, it becomes possible to maintain a state in which both of the outer belt section 42 and the inner belt section 41 cover the opening 10 formed in the casing 1. This makes it possible to isolate the ambience of the outside space S3 and the ambience of the inside space S1 from each other. As a result, it becomes possible to improve the effect (dust-proof effect) of preventing the particles generated in the drive mechanism 3 located in the inside space S3 from being released to the outside space S1, compared to the prior art example. In addition, since the exhaust mechanism 8 intakes the gas present in the buffering space S2 formed between the inner belt section 41 and the outer belt section 42, it becomes possible to effectively prevent a situation in which the gas flows from the outside space S3 of the casing 1 into the inside space S1 of the casing 1. As a result, if the gas present in the outside space S1 contains a corrosive gas, it becomes possible to prevent this corrosive gas from flowing into the inside space S1.

Embodiment 2

Figure 4:
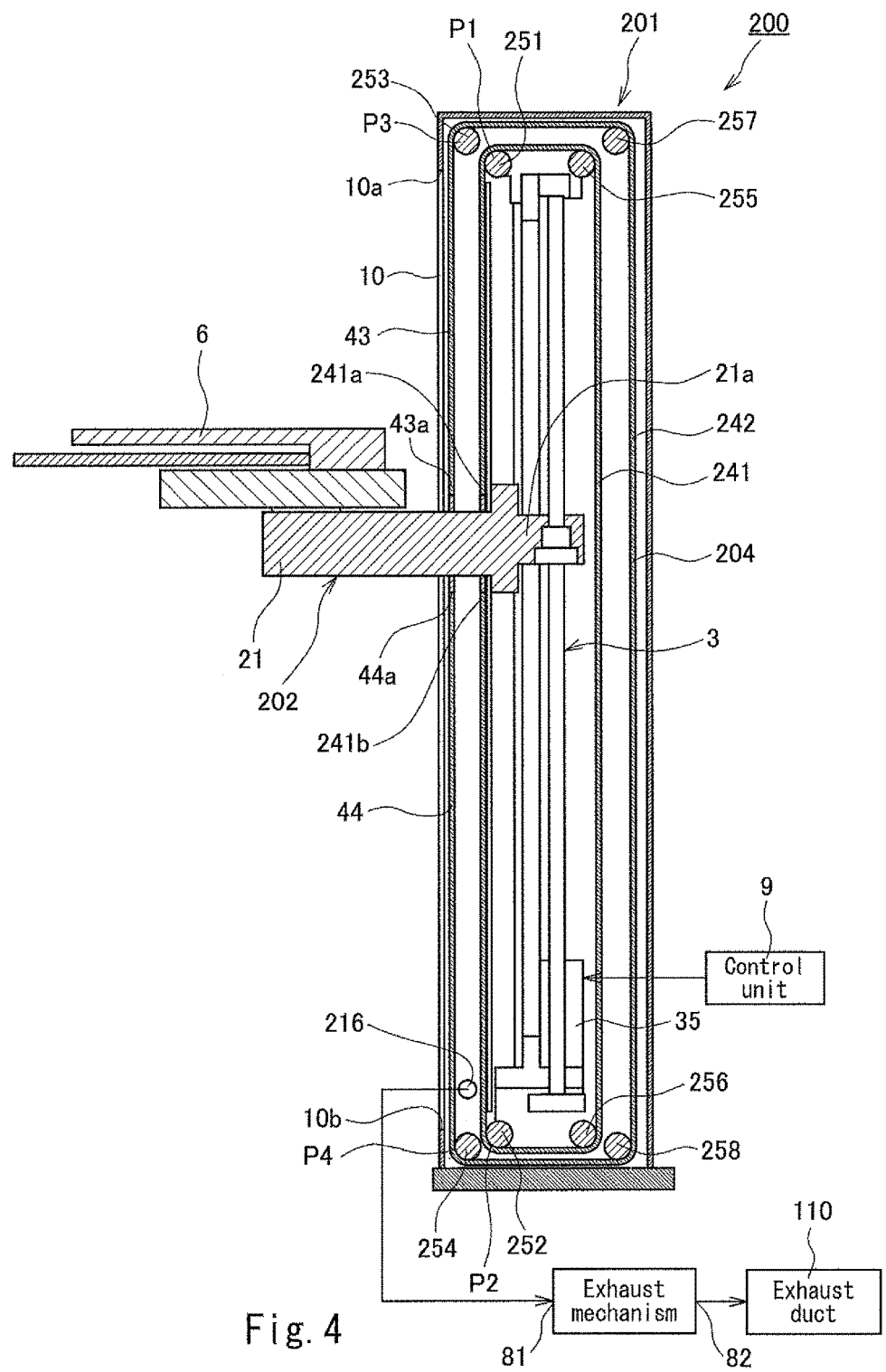
FIG. 4 is a longitudinal sectional view showing the exemplary configuration of a robot according to Embodiment 2 of the present invention.

FIG. 4 is a longitudinal sectional view showing the exemplary configuration of a robot 200 according to Embodiment 2 of the present invention.

As shown in FIG. 4, the robot 200 includes a casing 201, a movable member 202, the drive mechanism 3, a seal belt 204, the plurality of fixed rollers fastened to the casing 1, the hand 6, and the control unit 9.

Hereinafter, differences between the above-described Embodiment 1 and the present embodiment will be mainly described.

The configuration of the drive mechanism 3, the configuration of the hand 6, and the configuration of the control unit 9 are the same as those of the above-described Embodiment 1 and will not be described repeatedly.

The casing 201 includes an exhaust port 216 which is a through-hole formed to make the buffering space S2 in the inside region of the casing 1 which is formed in one of the side walls 13 communicate with the outside space S3. The other constituents of the casing 201 are the same as those of the casing 1 of the above-described Embodiment 1, and therefore will not be described repeatedly.

In the exemplary aspect of the present embodiment, the movable member 202 includes the movable mount 21. However, the movable member 202 is not provided with members corresponding to the first movement roller 22 and the second movement roller 23 of the above-described Embodiment 1. The other constituents of the movable member 202 are the same as those of the movable member 2 of the above-described Embodiment 1, and will not be described repeatedly.

In the exemplary aspect of the present embodiment, the seal belt 204 includes an inner belt 241 and an outer belt 242 which are band members which do not substantially have a stretch property. The outer belt 242 is placed between the inner belt 241 and the opening 10 of the casing 1. The inner belt 241 constitutes an inner belt section, while the outer belt 242 constitutes an outer belt section. In this way, the inner belt section and the outer belt section are constituted by separate belts, respectively.

A first end (one end) 241a of the inner belt 241 is fastened to the upper surface of a portion of the inside section 21a of the movable member 202, the portion being in the vicinity of the opening 10. A second end (the other end) 241b of the inner belt 241 is fastened to the lower surface of a portion of the inside section 21a of the movable member 202, the portion being in the vicinity of the opening 10. A portion of the inner belt 241 which is between the first end 241a of the inner belt 241 and the second end 241b of the inner belt 241 is wrapped around a plurality of fixed rollers (a third fixed roller 251, a fourth fixed roller 252, a third reversing roller 255, and a fourth reversing roller 256 which will be described later) fastened to the casing 1.

The outer belt 242 includes the first portion 43 and the second portion 44. The first end 43a of the first portion 43 is fastened to the upper surface of a portion of the inside section 21a of the movable member 202, the portion being in the vicinity of the opening 10, and located between a portion of the inside section 21a to which the first end 241a of the inner belt 241 is fastened, and the opening 10. The first end (one end) 44a of the second portion 44 of the outer belt 242 is fastened to the lower surface of a portion of the inside section 21a of the movable member 202, the portion being in the vicinity of the opening 10, and located between a portion of the inside section 21a to which the second end 241b of the inner belt 241 is fastened, and the opening 10.

The remaining portion of the first portion 43 extends along the opening 10, from the upper surface of a portion of the inside section 21a of the movable mount 21, the portion being in the vicinity of the opening 10, to the third space position P3 which is beyond (above) the upper end 10a of the opening 10, and further to a location that is beyond the third space position P3. The remaining portion of the second portion 44 extends along the opening 10, from the lower surface of a portion of the inside section 21a of the movable mount 21, the portion being in the vicinity of the opening 10, to the fourth space position P4 which is beyond (below) the lower end 10b of the opening 10, and further to a location that is beyond the fourth space position P4. The second end of the first portion 43 is continuous with the second end of the second portion 44. A portion of the outer belt 242 which is between the first end 43a of the first portion 43 and the first end 44a of the second portion 44 is wrapped around a plurality of fixed rollers (a fifth fixed roller 253, a sixth fixed roller 254, a fifth reversing roller 257, and a sixth reversing roller 258 which will be described later) fastened to the casing 1.

The outer belt 242 is placed in such a manner that a gap is formed between the front wall 11 of the casing 1, and a portion of the first portion 43, the portion extending along the portion 10 and a portion of the second portion 44, the portion extending along the opening 10. This makes it possible to prevent a situation in which the particles are generated due to the fact that scraping occurs between the front wall 11 of the casing 1, and the portion of the first portion 43, the portion extending along the opening 10 and the portion of the second portion 44, the portion extending along the opening 10, and thereby the yield of a product is reduced.

The robot 200 includes the third fixed roller 251, the fourth fixed roller 252, the fifth fixed roller 253, the sixth fixed roller 254, the third reversing roller 255, the fourth reversing roller 256, the fifth reversing roller 257, and the sixth reversing roller 258.

The third fixed roller 251, the fourth fixed roller 252, the fifth fixed roller 253, the sixth fixed roller 254, the third reversing roller 255, the fourth reversing roller 256, the fifth reversing roller 257, and the sixth reversing roller 258 are columnar (cylindrical) members, respectively, extending in the width direction of the opening 10. Each of the third fixed roller 251, the fourth fixed roller 252, the fifth fixed roller 253, the sixth fixed roller 254, the third reversing roller 255, the fourth reversing roller 256, the fifth reversing roller 257, and the sixth reversing roller 258 is rotatably supported at both ends thereof on the casing 1 via a support member (not shown) and fastened to the casing 1 in such a manner that each of them is rotatable around a rotational axis thereof extending in the width direction of the opening 10. Alternatively, the third to tenth fixed rollers may be directly attached to the casing 1.

The third fixed roller 251 is located at the first space position P1. The fourth fixed roller 252 is located at the second space position P2. The third reversing roller 255 is located between the third fixed roller 251 and the back wall 12. The fourth reversing roller 256 is located between the fourth fixed roller 252 and the back wall 12. The third reversing roller 255 and the fourth reversing roller 256 constitute rollers for reversing the inner belt 241 at an intermediate position between the first fixed roller 51 and the second fixed roller 52, in the direction in which the inner belt 241 extends.

The inner belt 241 is wrapped around the third fixed roller 251, the third reversing roller 255, the fourth reversing roller 256, and the fourth fixed roller 252 in this order, in a direction from the first end 241a toward the second end 241b.

The fifth fixed roller 253 is located outward relative to the upper end 10a of the opening 10 and the third fixed roller 251, in the inside region of the casing 1. This position of the fifth fixed roller 253 is the third space position P3 of the above-described Embodiment 1. The sixth fixed roller 254 is located outward relative to the lower end 10b of the opening 10 and the fourth fixed roller 252, in the inside region of the casing 1. This position of the sixth fixed roller 254 is the fourth space position P4 of the above-described Embodiment 1.

The fifth reversing roller 257 is placed outward relative to the third reversing roller 255, between the fifth fixed roller 253 and the back wall 12. The sixth reversing roller 258 is placed outward relative to the fourth reversing roller 256, between the sixth fixed roller 254 and the back wall 12. The fifth reversing roller 257 and the sixth reversing roller 258 constitute rollers for reversing the outer belt 242 at an intermediate position between the fifth fixed roller 253 and the sixth fixed roller 254, in the direction in which the outer belt 242 extends.

The outer belt 242 is wrapped around the fifth fixed roller 253, the fifth reversing roller 257, the sixth reversing roller 258, and the sixth fixed roller 254 in this order, in a direction from the first end 43a of the first portion 43 toward the first end 44a of the second portion 44.

As described above, the drive mechanism 3 is located in the inside space S1 surrounded by the inner belt 241, and the buffering space S2 is located between the outer belt 242 and the inner belt 241. Therefore, the exhaust port 16 formed in one of the side walls 13 connects the outside space S3 and the buffering space S2 to each other.

In the robot 200 configured as described above, when the control unit 9 drives the drive mechanism 3 to move the movable member 202, the inner belt 241 and the outer belt 242 revolve according to the movement of the movable member 2. Thus, while the movable member 202 is moving, no gap is formed between the upper end 10a of the opening 10 and the movable member 202, and between the lower end 10b of the opening 10 and the movable member 202, and it becomes possible to maintain a state in which both of the outer belt 242 and the inner belt 241 cover the opening 10 formed in the casing 1. This makes it possible to isolate the ambience of the outside space S3 and the ambience of the inside space S1 from each other. As a result, it becomes possible to improve the effect (dust-proof effect) of preventing the particles generated in the drive mechanism 3 located in the inside space S3 from being released to the outside space S1, compared to the prior art example.

MODIFIED EXAMPLES

Although in the above-described embodiments, the opening 10 of the casing 1 extends in the straight-line shape, the opening 10 is not limited to this. For example, alternatively, the opening 10 may extend to be curved.

Although in the above-described embodiments, the opening 10 of the casing 1 extends vertically, the opening 10 is not limited to this. For example, alternatively, the opening 10 may extend horizontally.

Numerous improvements and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

The present invention is applicable to a conveying device in equipment which treats works.

REFERENCE SIGNS LIST

S1 inside space
S2 buffering space
S3 outside space
1 casing
2 movable member
3 drive mechanism
4 seal belt
6 hand
7 separating wall
7a outer side edge portion
7b inner side edge portion
8 exhaust mechanism
9 control unit
10 opening
10a upper end
10b lower end
11 front wall
12 back wall
13 side wall
14 upper wall
15 bottom wall
16 intake port
21 movable mount
21a inside section
21b outside section
22 first movement roller
23 second movement roller
31 ball screw
32 slider
33 guide rail
34 gear
35 servo motor
41 inner belt section
41a first end (one end)
41b second end (the other end)
42 outer belt section
43 first portion
43a first end (one end)
43b second end (the other end)
44 second portion
44a first end (one end)
44b second end (the other end)
45 inner upper seal section
46 inner lower seal section
47 outer upper seal section
48 outer lower seal section
51 first fixed roller
52 second fixed roller
53 first reversing roller
54 second reversing roller
81 suction port
82 discharge port
100 robot
110 exhaust duct

The invention claimed is:
1. A robot comprising:
a casing formed with an opening, the opening extending in a specified direction, having a first end and a second end in the specified direction, and having a width in a width direction of the opening that is perpendicular to the specification direction;
a movable mount extending in an inside region and an outside region of the casing through the opening, and having an outside section extending in the outside region of the casing, the outside section being provided with a hand;
a drive mechanism accommodated in the casing and configured to drive an inside section of the movable mount, the inside section extending in the inside region of the casing, to move the movable mount in the specified direction in which the opening extends; and
a seal belt accommodated in the inside region of the casing,
wherein the seal belt includes an inner belt section and an outer belt section, each of the inner belt section and the outer belt section extending in the specified direction in which the opening extends in such a manner that both side edges of each of the inner belt section and the outer belt section are located outward relative to both side edges of the opening, when viewed from a normal line direction of the opening that is perpendicular to both the specific direction and the width direction of the opening,
each of the inner belt section and the outer belt section has a width in the width direction of the opening that is larger than the width of the opening when viewed from the normal line direction,
the outer belt section is located between the opening and the inner belt section along the normal line direction, and
the opening is fully covered by each of the inner belt section and the outer belt section when viewed from the normal direction,
wherein in the inside region of the casing,
a first end of the inner belt section is retained at a portion of the inside section of the movable mount, the portion being closer to the first end of the opening,
a portion of the inner belt section which is other than the first end of the inner belt section extends along the opening, from the portion of the inside section of the movable mount, the portion being closer to the first end of the opening, to a first space position which is closer to the first end of the opening than the inside section of the movable mount is,
the portion of the inner belt section which is other than the first end of the inner belt section extends from the first space position to a second space position which is closer to the second end of the opening than the inside section of the movable mount is in such a manner that the portion of the inner belt section which is other than the first end of the inner belt section is reversed at an intermediate position between the first space position and the second space position, and further extends from the second space position along the opening,
a second end of the inner belt section is retained at a portion of the inside section of the movable mount, the portion being closer to the second end of the opening, and
the inner belt section revolves according to movement of the movable mount,
wherein the outer belt section includes a first portion and a second portion,
between the inner belt section and the opening, a first end of the first portion is retained at the portion of the inside section of the movable mount, the portion being closer to the first end of the opening, and a portion of the first portion which is other than the first end of the first portion extends along the opening, from the portion of the inside section of the movable mount, the portion being closer to the first end of the opening, to a third space position which is beyond the first end of the opening, and is retained at the third space position,
between the inner belt section and the opening, a first end of the second portion is retained at the portion of the inside section of the movable mount, the portion being closer to the second end of the opening, and a remaining portion of the second portion which is other than the first end of the second portion extends along the opening, from the portion of the inside section of the movable mount, the portion being closer to the second end of the opening, to a fourth space position which is beyond the second end of the opening, and is retained at the fourth space position, and
a length of one of the first portion and the second portion is changed to be increased by a decrease in a length of the other of the first portion and the second portion according to the movement of the movable mount,
wherein a portion of the inner belt section extending from the first end to the first space position and the first portion of the outer belt section face each other,
wherein a portion of the inner belt section extending from the second space position to the second end and the second portion of the outer belt section face each other, and
wherein the drive mechanism is placed in a space surrounded by the inner belt section.

2. The robot according to claim 1,
wherein the first space position, the first end of the inner belt section, the second end of the inner belt section and the second space position are lined up in this order along a direction that is parallel with the specified direction along which the opening extends.

3. The robot according to claim 1, comprising:
a third fixed roller placed at the first space position and fastened to the casing in such a manner that the third fixed roller is rotatable around a rotational axis extending in the width direction of the opening;
a fourth fixed roller placed at the second space position and fastened to the casing in such a manner that the fourth fixed roller is rotatable around a rotational axis extending in the width direction of the opening;
a fifth fixed roller placed outward relative to the first end of the opening and the third fixed roller in the inside region of the casing, and fastened to the casing in such a manner that the fifth fixed roller is rotatable around a rotational axis extending in the width direction of the opening; and
a sixth fixed roller placed outward relative to the second end of the opening and the fourth fixed roller in the inside region of the casing, and fastened to the casing in such a manner that the sixth fixed roller is rotatable around a rotational axis extending in the width direction of the opening,
wherein the first end of the inner belt section is fastened to the portion of the inside section of the movable member, the portion being closer to the first end of the opening, and the second end of the inner belt section is fastened to the portion of the inside section of the movable member, the portion being closer to the second end of the opening,
wherein a portion of the inner belt section which is between the first end of the inner belt section and the second end of the inner belt section is wrapped around the third fixed roller and the fourth fixed roller, and is wrapped around a roller for reversing the inner belt section at an intermediate position between the third fixed roller and the fourth fixed roller, wherein the first end of the first portion of the outer belt section is fastened to the portion of the inside section of the movable mount, the portion being closer to the first end of the opening, and the first end of the second portion of the outer belt section is fastened to the portion of the inside section of the movable mount, the portion being closer to the second end of the opening, and wherein the portion of the first portion of the outer belt section which is other than the first end extends to a location that is beyond the third space position at which the remaining portion of the first portion is retained, the portion of the second portion of the outer belt section which is other than the first end extends to a location that is beyond the fourth space position at which the portion of the second portion which is other than the first end is retained, the second end of the first portion and the second end of the second portion are continuous with each other, a portion of the outer belt section which is between the first end of the first portion and the first end of the second portion is located between the inner belt section and the casing, wrapped around the fifth fixed roller and the sixth fixed roller, and wrapped around a roller for reversing the outer belt section at an intermediate position between the fifth fixed roller and the sixth fixed roller, and wherein the inner belt section and the outer belt section separately constitute an inner belt and an outer belt, respectively.

4. The robot according to claim 1, further comprising:
a separating wall placed to extend along a portion of the inner belt section, the portion being located between the first end of the inner belt section and the first space position, and being closer to the drive mechanism, and along a portion of the inner belt section, the portion being located between the second end of the inner belt section and the second space position, and being closer to the drive mechanism.

5. The robot according to claim 1, further comprising:
a blower device which intakes a gas in a buffering space formed between the outer belt section and the inner belt section.

6. A robot, comprising:
a casing formed with an opening extending in a specified direction and having a first end and a second end in the specified direction;
a movable mount extending in an inside region and an outside region of the casing through the opening, and having an outside section extending in the outside region of the casing, the outside section being provided with a hand;
a drive mechanism accommodated in the casing and configured to drive an inside section of the movable mount, the inside section extending in the inside region of the casing, to move the movable mount in the specified direction in which the opening extends; and
a seal belt accommodated in the inside region of the casing,
wherein the seal belt includes an inner belt section and an outer belt section, each of the inner belt section and the outer belt section extending in the specified direction in which the opening extends in such a manner that both side edges of each of the inner belt section and the outer belt section are located outward relative to both side edges of the opening, when viewed from a normal line direction of the opening, wherein in the inside region of the casing,
a first end of the inner belt section is retained at a portion of the inside section of the movable mount, the portion being closer to the first end of the opening,
a portion of the inner belt section which is other than the first end of the inner belt section extends along the opening, from the portion of the inside section of the movable mount, the portion being closer to the first end of the opening, to a first space position which is closer to the first end of the opening than the inside section of the movable mount is,
the portion of the inner belt section which is other than the first end of the inner belt section extends from the first space position to a second space position which is closer to the second end of the opening than the inside section of the movable mount is in such a manner that the portion of the inner belt section which is other than the first end of the inner belt section is reversed at an intermediate position between the first space position and the second space position, and further extends from the second space position along the opening,
a second end of the inner belt section is retained at a portion of the inside section of the movable mount, the portion being closer to the second end of the opening, and
the inner belt section revolves according to movement of the movable mount,
wherein the outer belt section includes a first portion and a second portion,
between the inner belt section and the opening, a first end of the first portion is retained at the portion of the inside section of the movable mount, the portion being closer to the first end of the opening, and a portion of the first portion which is other than the first end of the first portion extends along the opening, from the portion of the inside section of the movable mount, the portion being closer to the first end of the opening, to a third space position which is beyond the first end of the opening, and is retained at the third space position,
between the inner belt section and the opening, a first end of the second portion is retained at the portion of the inside section of the movable mount, the portion being closer to the second end of the opening, and a portion of the second portion which is other than the first end of the second portion extends along the opening, from the portion of the inside section of the movable mount, the portion being closer to the second end of the opening, to a fourth space position which is beyond the second end of the opening, and is retained at the fourth space position, and
a length of one of the first portion and the second portion is changed to be increased by a decrease in a length of the other of the first portion and the second portion according to the movement of the movable mount,
the robot further comprising:
a first movement roller attached to the portion of the inside section of the movable mount, the portion being closer to the first end of the opening in such a manner that the first movement roller is rotatable around a rotational axis extending in a width direction of the opening;
a second movement roller attached to the portion of the inside section of the movable mount, the portion being closer to the second end of the opening in such a manner that the second movement roller is rotatable around a rotational axis extending in the width direction of the opening;

a first fixed roller placed at the first space position and fastened to the casing in such a manner that the first fixed roller is rotatable around a rotational axis extending in the width direction of the opening; and a second fixed roller placed at the second space position and fastened to the casing in such a manner that the second fixed roller is rotatable around a rotational axis extending in the width direction of the opening, wherein the first end of the inner belt section and the first end of the first portion of the outer belt section are continuous with each other to form a continuous portion, and the continuous portion is wrapped around the first movement roller and retained at the portion of the inside section of the movable mount, the portion being closer to the first end of the opening, wherein the portion of the first portion of the outer belt section which is other than the first end extends from the first movement roller to the third space position and is fastened to the casing at the third space position, wherein the second end of the inner belt section and the first end of the second portion of the outer belt section are continuous with each other to form a continuous portion, and the continuous portion is wrapped around the second movement roller and retained at the portion of the inside section of the movable mount, the portion being closer to the second end of the opening, wherein the portion of the second portion of the outer belt section which is other than the first end extends from the second movement roller to the fourth space position and is fastened to the casing at the fourth space position, and wherein a portion of the inner belt section which is between the first end of the inner belt section and the second end of the inner belt section is wrapped around the first fixed roller and the second fixed roller, and is wrapped around a roller for reversing the inner belt section at an intermediate position between the first fixed roller and the second fixed roller.

* * * * *